United States Patent [19]
Letterman, Jr. et al.

[11] Patent Number: 5,886,400
[45] Date of Patent: Mar. 23, 1999

[54] SEMICONDUCTOR DEVICE HAVING AN INSULATING LAYER AND METHOD FOR MAKING

[75] Inventors: James P. Letterman, Jr., Mesa; Reginald K. Asher, Scottsdale, both of Ariz.

[73] Assignee: Motorola, Inc., Schaumburg, Ill.

[21] Appl. No.: 963,322

[22] Filed: Nov. 3, 1997

Related U.S. Application Data

[63] Continuation of Ser. No. 522,474, Aug. 31, 1995, abandoned.

[51] Int. Cl.$^6$ ............................ H01L 23/02; H01L 23/28; H01L 23/36; H01L 23/34
[52] U.S. Cl. ............................ 257/675; 257/796; 257/693; 257/698; 257/707; 257/709; 257/717; 257/790
[58] Field of Search ........................................ 257/796, 790

[56] References Cited

U.S. PATENT DOCUMENTS

| | | | |
|---|---|---|---|
| 3,902,148 | 8/1975 | Drees et al. ............................. | 257/796 |
| 4,001,655 | 1/1977 | Voyles et al. ............................ | 257/786 |
| 4,451,973 | 6/1984 | Tateno et al. ............................ | 257/796 |
| 4,503,452 | 3/1985 | Yokozawa et al. ...................... | 257/675 |
| 4,750,030 | 6/1988 | Hatakeyama ............................ | 257/675 |
| 4,910,581 | 3/1990 | Baird ....................................... | 257/717 |
| 4,961,107 | 10/1990 | Geist et al. ............................. | 257/675 |
| 5,034,800 | 7/1991 | Marchisi ................................. | 257/695 |
| 5,038,200 | 8/1991 | Hosomi et al. ......................... | 257/796 |
| 5,087,962 | 2/1992 | de Vos et al. ........................... | 257/687 |
| 5,309,027 | 5/1994 | Letterman .............................. | 257/796 |
| 5,367,196 | 11/1994 | Mahulikar et al. ..................... | 257/67 |
| 5,389,159 | 2/1995 | Kataoka et al. ........................ | 257/433 |
| 5,402,006 | 3/1995 | O'Donley ............................... | 257/675 |
| 5,422,788 | 6/1995 | Heinen et al. .......................... | 257/796 |
| 5,530,286 | 6/1996 | Murakami et al. ..................... | 257/693 |
| 5,596,231 | 1/1997 | Combs .................................... | 257/796 |

FOREIGN PATENT DOCUMENTS

| | | | |
|---|---|---|---|
| 59-21076 | 2/1984 | Japan ..................................... | 257/790 |
| 59-72753 | 4/1984 | Japan ..................................... | 257/796 |
| 59-130449 | 7/1984 | Japan ..................................... | 257/796 |
| 0131551 | 6/1986 | Japan ..................................... | 257/796 |
| 16605 | 7/1986 | Japan ..................................... | 257/796 |
| 61-280640 | 12/1986 | Japan ..................................... | 257/796 |
| 63-73541 | 4/1988 | Japan ..................................... | 257/796 |
| 63-28595 Z | 11/1988 | Japan ..................................... | 257/796 |
| 59-218759 | 12/1988 | Japan ..................................... | 257/796 |
| 2-106952 | 4/1990 | Japan ..................................... | 257/790 |
| 0027557 | 2/1991 | Japan ..................................... | 257/790 |
| 0058453 | 3/1991 | Japan ..................................... | 257/790 |
| 3-49253 | 3/1991 | Japan ..................................... | 257/796 |
| 0092459 | 3/1992 | Japan ..................................... | 257/790 |
| 0306866 | 10/1992 | Japan ..................................... | 257/790 |

*Primary Examiner*—Alexander Oscar Williams
*Attorney, Agent, or Firm*—Kenneth M. Seddon; Daniel R. Collopy

[57] ABSTRACT

An electrical insulation for a heatsink (14) of a semiconductor device (10) is provided by an insulating layer (16) formed on a desired portion or portions of the semiconductor device (10) to protect a semiconductor die (17) from arcing currents due to high voltage potentials. The insulating layer (16) is formed from a non-conductive powder coating which is applied to the semiconductor devices (10) by attracting the powder to the semiconductor device (10) in one of four ways. Either a fluidized powder bed process, an electrostatic fluidized bed process, an electrostatic spraying process, or the powder is applied during the mold process on the desired surface of the semiconductor device (10). Once the powder coating is applied to the heatsink (14), the semiconductor package is cured to form the insulating layer (16). The insulating layer (16) can also be formed over other portions the semiconductor device (10) such as a body (13), leads (12), or a leadframe (11).

26 Claims, 1 Drawing Sheet

SEMICONDUCTOR DEVICE HAVING AN INSULATING LAYER AND METHOD FOR MAKING

This application is a continuation of prior application Ser. No. 08/522,474, filed Aug. 31, 1995 now abandoned.

BACKGROUND OF THE INVENTION

The present invention relates, in general, to semiconductor packages, and more particularly, to semiconductor packages having high electrical breakdown resistance.

Many semiconductor packages include a heatsink which is thermally coupled to a semiconductor die for the dissipation of heat during the operation of the semiconductor device. At times, these heatsinks are also electrically connected to the semiconductor die through a die flag. To protect the semiconductor device from high current flow due to high voltage potentials, it is necessary to electrically insulate the heatsink of the semiconductor device.

One method relies on insulating the heatsink when it is mounted onto a circuit board as part of a larger system. To help cool each component in a system, the heatsink of each package is mounted onto a larger heatsink which dissipates the heat generated by the entire system. To electrically insulate the heatsink of the package from the heatsink of the system, the package is coated with grease and mounted onto a non-conductive pad with an insulated screw. This method adds cost to the system and reduces the efficiency of the heatsink to dissipate heat.

Some other previously known techniques which insulate the heatsink of the package, rely on forming a layer of molding compound between the heatsink and semiconductor die or encapsulate both the heatsink and semiconductor die in molding compound. The mold compound used must be thermally conductive which is more expensive than the standard mold compound used in the industry. Both of these techniques are adequate for insulating the heatsink of a semiconductor package, but do so with added assembly cost.

Accordingly, it would be advantageous to have a method for insulating the heatsink of a semiconductor package so that the package can be mounted into a system and offer protection from currents which can result due to high voltage potentials. It would be of further advantage to provide a method that offers the flexibility to perform the method during any step of the assembly process and do so while adding nominal cost to the final product. It would be of even further advantage if the method did not require any environmentally hazardous chemicals or produce any by-products which must be disposed of. It would also be advantageous if this method could also be used to electrically isolate portions of a semiconductor device from each other.

DETAILED DESCRIPTION OF THE DRAWINGS

Many power devices generate a considerable amount of heat during operation which must be dissipated. Typically a heatsink is added to the semiconductor package which is thermally coupled to the power device. The heatsink is then mounted onto a system board which in itself is a heatsink for an entire system. With some package configurations, the heatsink is also electrically connected to the semiconductor die. Therefore it is necessary to insulate the heatsink of the package to protect the semiconductor device from current spikes which can result from voltage potentials in the system environment which can exceed 4500 volts. In the present invention a fluidized powder coating process is used, as illustrated in the figures, to form an insulating film, insulating paint, or insulating layer 16 over at least a portion of a heatsink 14 of a semiconductor device or semiconductor device 10.

Figure 1:
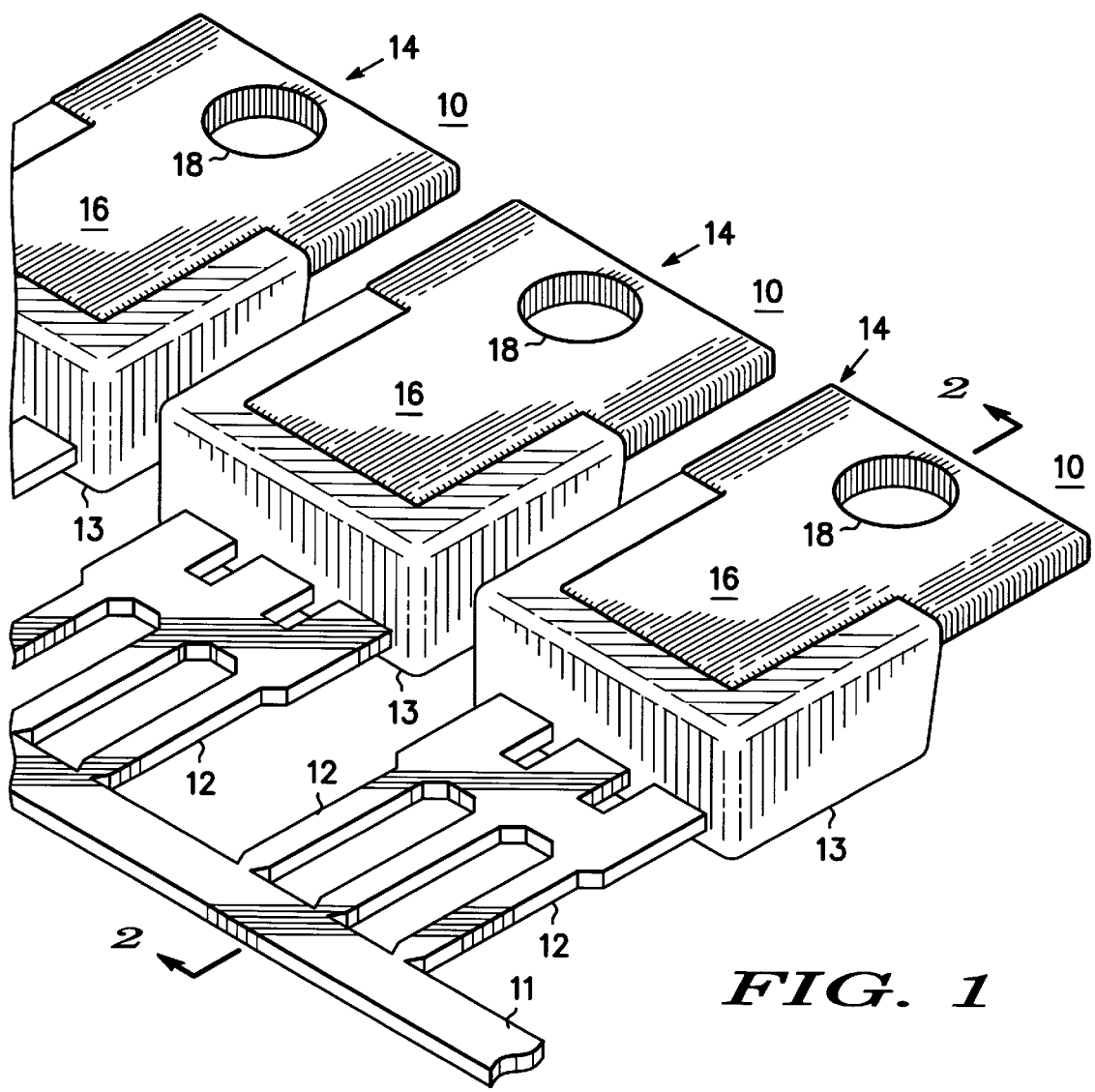
FIG. 1 is an isometric view of semiconductor packages according to the present invention.

FIG. 1 is an isometric view of semiconductor devices 10 which are part of a sequence formed on leadframe 11. Prior to forming insulating layer 16 over a heatsink 14, a semiconductor die 17 (see FIG. 2) is mounted to a flag area (not shown) of each device 10, the semiconductor die 17 is wire bonded to leads 12, and then encapsulated with a body 13 comprising a mold compound. Previously known methods for forming a semiconductor package covered heatsink 14 with a thermoplastic mold compound which is more expensive than the standard mold compound used in the industry. With the present invention, heatsink 14 does not need to be covered by the thermoplastic mold compound, therefore the less expensive standard mold compound can be used. Insulating layer 16 is formed on all surfaces of heatsink 14 not covered by mold compound 13, including those surfaces formed by hole 18 which is used to mount semiconductor device 10 onto a support (not shown). Since all surfaces of heatsink 14 are covered with insulating layer 16, there is no need to use grease, a non-conductive pad, or an insulated mounting screw when semiconductor device 10 is installed into an application. This not only simplifies the assembly process, but reduces the cost as well.

Figure 2:
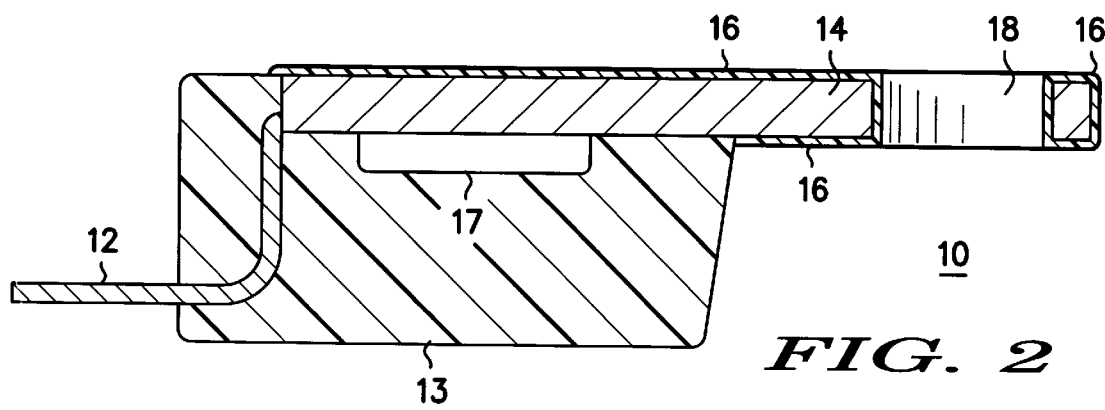
FIG. 2 is an enlarged cross-sectional view of a semiconductor package according to the present invention.

FIG. 2 is an enlarged cross-sectional view of semiconductor device 10 along the lines 2–2 shown in FIG. 1. Insulating layer 16 is 25 to 500 microns in thickness and covers all exposed and conductive surfaces of heatsink 14. Since insulating layer 16 is so thin, it has a minimal impact on the efficiency of heatsink 14 to dissipate thermal energy. Insulating layer 16 can also be formed such that portions of body 13 or leads 12 are covered. If electrical contact to heatsink 14 is required, then using the process described below, it is possible to form insulating layer 16 on only selective surfaces of heatsink 14 or portions of leadframe 11, leads 12, or body 13.

Insulating layer 16 comprises a non-conductive powder coating material suitable for application with a powder coating technique such as those described in the present invention. The powder coating can comprise epoxy, epoxy and polyester hybrids, polypropylene, polyethylene, acrylic, polyester, nylon, Triglycidylisocyanurate (T.G.I.C), Sumitomo 5900H which is a trademark of Sumitomo Bakelite of Tokyo, Japan, Hysol 0459 which is a trademark of the Dexter Electronic Materials of Olean, New York, or a combination thereof. Additives may be placed in the powder which improve the break down voltage protection, enhance the marking added to semiconductor device 10 to identify the part type, or to improve the resistance of semiconductor device 10 to environmental conditions. For example, using T.G.I.C. for the powder coating will protect semiconductor die 17 from arcing currents due to a breakdown voltage up to 1500 volts. Methods for forming insulating layer 16 rely on attracting the powder coating to semiconductor device 10 using either thermal adhesion, electrostatic adhesion, or a combination of the two.

Four methods for forming insulating layer 16 on semiconductor device 10 will now be described. It will be understood that the preset invention is not limited to these methods and any method which applies a non-conductive powder to a semiconductor device is considered an equivalent technique. The first application process is a fluidized powder bed process which relies on applying the powder coating using thermal adhesion. The fluidized bed is a chamber which contains the powder coating which is suspended in the bed using compressed air. Semiconductor device 10 is preheated to a temperature to attract the non-conductive powder such as 100° F. to 750° F. Care must be taken not to heat semiconductor device 10 above the point where damage can occur to the package or semiconductor die 17. The portions of semiconductor device 10 which are desired to be coated with insulating layer 16 are submerged into the fluidized bed. Portions of semiconductor device 10 may be masked off to prevent insulating layer 16 from forming on these selected portions. The combination of the heat and the powder coming in contact with device 10, will result in the powder melting and forming insulating layer 16. The thickness and breakdown voltage characteristics of insulating layer 16 can be controlled by the amount of time semiconductor device 10 is immersed in the fluidized bed and the preheat temperature of semiconductor device 10.

A second method for adhering the powder coating to semiconductor device 10 is called electrostatic fluidized bed process. This process is similar to the fluidized powder bed process except an electric field is also used to aid in the attraction of the powder coating to device 10. Insulating layer 16 is formed by placing an electric potential on the portion of semiconductor device 10 where insulating layer 16 is desired. For safety reasons, heatsink 14 is usually grounded by grounding leadframe 11 or leads 12. The fluidized bed is then charged to 30 kilovolts to 100 kilovolts to create a cloud of charged non-conductive powder which is attracted to the grounded heatsink 14. Only the portions of device 10 which are grounded and not masked off will attract the charged powder and subsequently form insulated layer 16.

A third method for applying the non-conductive powder to semiconductor device 10 uses an electrostatic powder spraying process. Again the portions of semiconductor device 10 which are to be insulated, are electrically grounded. An electrostatic powder spray gun charges the powder to 30 kilovolts to 100 kilovolts and directs the powder towards semiconductor device 10 using compressed air. The charged powder will continue to build on the grounded surfaces of device 10 until the surface is electrically insulated and no longer conducts.

A fourth method for applying the non-conductive powder to semiconductor device 10 does so during the molding process of body 13. Prior to injecting a mold compound into a mold chamber to form body 13, the portions of the mold chamber which correspond to the portions of semiconductor device 10 that require insulating layer 16, are covered with the non-conductive coating. It will also be understood that the thickness and composition of the non-conductive powder can be varied to adjust the electrical isolation properties, the thermal conduction properties, the marking properties, and the hermetic properties of insulating layer 16.

After all four techniques for applying the non-conductive powder to semiconductor device 10, the powder may be cured to cross-link the compound. If the powder coating used in one of the above mentioned techniques requires a curing step, then semiconductor device 10 is heated or baked. The curing step may be required to drive out moisture or modify the chemical composition of insulating layer 16. Insulating layer 16 is resistant not only to electrical breakdown, but physical breakdown due to environmental conditions as well. Since a powder is used to form insulating layer 16, there is no need to use solvents or paint thinners in any of the four application processes. Therefore the present invention does not require any environmentally hazardous chemicals or produce any by-products which must be disposed of.

In a high volume production environment, the most cost effective method for forming insulating layer 16 is when the semiconductor devices 10 are still attached to leadframe 11. This allows any portion of the semiconductor device 10 to be masked off to prevent the non-conductive powder from adhering where it is not desired. If the powder coating is applied while device 10 is still attached to leadframe 11, then there is no risk of damaging semiconductor die 17 since all of the leads 12 are grounded therefore no damaging current will flow. The present invention offers greater flexibility over previously known techniques because there are no high temperature process steps and no pre-conditioning of the leadframe. Therefore the present invention can be used even after the device is tested, has been marked, or removed from leadframe 11.

The present invention can be used on semiconductor packages with various configurations. If a very thin insulated package is required, the powder coating can also be used to protect semiconductor die 17 or a portion thereof in lieu of a molded body. Insulating layer 16 can be formed on industry standard packages such as a TO-218 package, a TO-220 package, a TO-247 package, a Single In-line Package (SIP), a CASE 77 package, a TO3P package, a 340G-02 package, a D-pack, a $D^2$-pack, and a $D^3$-pack.

Another method for insulating a heatsink of a semiconductor package was taught in U.S. Pat. No. 5,309,027 which issued to Letterman et al. on May 3, 1994 and is hereby incorporated by reference. In the patent by Letterman et al. the heatsink was completely encapsulated by a molding compound which formed a body of a package. During the molding process, the package was held in place by pins which left holes in the molding compound which were filed by an insulator. Although this method effectively insulates the heatsink from the semiconductor package, the present invention achieves the same function without having to insulate the hole left by the pins.

By now it should be appreciated that the present invention provides a method for forming a semiconductor device having an insulated heatsink. A powder coating is applied to the exposed surfaces of the heatsink which obviates the need for grease, non-conductive pads, and insulated mounting screws. This method does not require any pre-conditioning of the leadframe which would typically involve high temperature process steps that would damage semiconductor die 17. It is possible to form the insulating layer during any portion of the assembly process. The cost of the powder coating process is very inexpensive and will reduce the total assembly cost of a semiconductor device. The present invention does not require any environmentally hazardous chemicals or produce any by products which must be disposed of.

We claim:

1. A semiconductor device comprising:
   a leadframe having a heatsink, wherein the heatsink is thermally coupled to a semiconductor die and has a surface;
   a plurality of leads extending from the leadframe;
   a mold compound encapsulating at least a portion of the leadframe; and
   an insulating layer comprising a powder coating that is over at least a majority of the surface of the heatsink, wherein the insulating layer is about 25 to 500 microns thick and comprises a material that is different than the mold compound.

2. The semiconductor device of claim 1, wherein the insulating layer is also formed over at least a portion of the mold compound.

3. The semiconductor device of claim 1, wherein the insulating layer is also formed over at least a portion of the plurality of leads.

4. The semiconductor device of claim 1 wherein the mold compound is a thermoplastic.

5. The semiconductor device of claim 1, wherein the leadframe, the plurality of leads, the heatsink, the mold compound, and the insulating layer form a semiconductor package selected from the group consisting of a TO-220 package, a TO-218 package, a TO-247 package, a SIP package, a CASE 77 package, a TO3P package, a 340G-02 package, a D-pack, a $D^2$-pack, and a $D^3$-pack.

6. The semiconductor device of claim 1, wherein the insulating layer protects the semiconductor device from a breakdown voltage up to 1500 volts.

7. The semiconductor device of claim 1, wherein the insulating layer is formed by a fluidized bed process.

8. The semiconductor device of claim 1, wherein the insulating layer is formed by an electrostatic fluidized bed process.

9. The semiconductor device of claim 1, wherein the insulating layer is formed by an electrostatic powder spraying process.

10. A semiconductor device comprising:

a semiconductor package comprising mold compound; and an insulating layer overlying at least a portion of the mold compound of the semiconductor package, wherein the insulating layer is a separate layer from the mold compound and comprises a non-conductive powder which is applied using a fluidized bed process, and wherein the insulating layer is about 25 to 500 microns thick.

11. The semiconductor device of claim 10, wherein the semiconductor package is selected from the group consisting of a TO-220 package, a TO-218 package, a TO-247 package, a SIP package, a CASE 77 package, a TO3P package, a 340G-02 package, a D-pack, a $D^2$-pack, and a $D^3$-pack.

12. The semiconductor device of claim 10, wherein the semiconductor package has a leadframe and the insulating layer overlies at least a portion of the leadframe.

13. The semiconductor device of claim 10, wherein the insulating layer protects the semiconductor device from a breakdown voltage of up to 1500 volts.

14. A semiconductor device comprising:

a semiconductor package having a body comprising mold compound; and an insulating layer overlying at least a portion of the semiconductor package, wherein the insulating layer is a distinct layer from the mold compound and comprises a non-conductive powder, the insulating layer having a thickness of about 25 to 500 microns.

15. The semiconductor device of claim 14, wherein the semiconductor package is selected from the group consisting of a TO-220 package, a TO-218 package, a TO-247 package, a SIP package, a CASE 77 package, a TO3P package, a 340G-02 package, a D-pack, a $D^2$-pack, and a $D^3$-pack.

16. The semiconductor device of claim 14, wherein the semiconductor package has a leadframe and the insulating layer overlies at least a portion of the leadframe.

17. The semiconductor device of claim 14, wherein the semiconductor package has a body and the insulating layer overlies at least a portion of the body.

18. The semiconductor device of claim 14, wherein the insulating layer protects the semiconductor device from a breakdown voltage of up to 1500 volts.

19. A semiconductor device comprising:

a leadframe having a heatsink, wherein the heatsink has a surface;

a mold compound encapsulating at least a portion of the leadframe; and an insulating layer over at least a majority of the surface of the heatsink, wherein the insulating layer is about 25 to 500 microns thick, is physically distinct from the mold compound, and comprises a dielectric material.

20. The semiconductor device of claim 19 wherein the insulating layer is thermally conductive and electrically insulating.

21. The semiconductor device of claim 19 further comprising a lead extending from the leadframe, wherein the insulating layer is over at least a portion of the lead.

22. An electronic component comprising:

a leadframe having a heatsink, wherein the heatsink has a surface;

a mold compound encapsulating at least a portion of the leadframe; and an insulating layer over at least a majority of the surface of the heatsink, wherein the insulating layer is about 25 to 500 microns thick and comprises a dielectric material, and wherein the insulating layer is distinctly separate from the mold compound.

23. The electronic component of claim 22 wherein the insulating layer is thermally conductive and electrically insulating.

24. The electronic component of claim 22 further comprising a lead extending from the leadframe, wherein the insulating layer is over at least a portion of the lead.

25. An electronic component comprising:

a semiconductor device;

a first insulating layer overlying at least a portion of the semiconductor device; and a second insulating layer contacting at least a portion of the first insulating layer, wherein the second insulating layer is different than the first insulating layer and comprises a dielectric material that is about 25 to 500 microns thick.

26. The semiconductor device of claim 25 wherein the first insulating layer is separated from the second insulating layer by a physical boundary.

* * * * *